(12) United States Patent
Nomura et al.

(10) Patent No.: US 6,317,362 B1
(45) Date of Patent: Nov. 13, 2001

(54) SEMICONDUCTOR MEMORY DEVICE

(75) Inventors: Hidemi Nomura; Akira Yoneyama, both of Gunma (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 09/614,778

(22) Filed: Jul. 12, 2000

(30) Foreign Application Priority Data

Jul. 13, 1999 (JP) .................................................. 11-199504
Jul. 13, 1999 (JP) .................................................. 11-199505

(51) Int. Cl.$^7$ .................................................. G11C 16/06
(52) U.S. Cl. .................................. 365/185.2; 365/185.21
(58) Field of Search ............................. 365/185.2, 185.21, 365/185.33

(56) References Cited

U.S. PATENT DOCUMENTS

| 5,142,495 | * | 8/1992 | Canepa .............................. 365/185.2 |
| 5,267,202 | * | 11/1993 | Dallabora et al. ................. 365/185.2 |
| 5,386,388 | * | 1/1995 | Atwood et al. .................... 365/185.2 |
| 5,629,892 | * | 5/1997 | Tang .................................. 365/185.2 |
| 5,659,503 | * | 8/1997 | Sudo et al. ........................ 365/185.2 |
| 5,684,739 | * | 11/1997 | Takeuchi ........................... 365/185.2 |
| 5,966,330 | * | 10/1999 | Tang et al. ........................ 365/185.2 |
| 6,097,633 | * | 8/2000 | La Placa ........................... 365/185.2 |
| 6,128,227 | * | 10/2000 | Kim ................................... 365/185.2 |

FOREIGN PATENT DOCUMENTS

WO 92/18980   11/1992  (WO).

* cited by examiner

*Primary Examiner*—Trong Phan
(74) *Attorney, Agent, or Firm*—Fish & Richardson P.C.

(57) ABSTRACT

A pair of reference cells 77 and 78 has the same structure as that of memory cells 51 and 52 and is arranged in the same direction on a semiconductor substrate. The memory cell 51 and the reference cell 77 (even cell) are coincident in their source/drain direction. The memory cell 52 and the reference cell 78 (odd cell) are coincident in their source/drain direction. A selection circuit 79 selects the reference cell 77 when the memory cell 51 is selected, whereas the selection circuit 79 selects the reference cell 78 when the memory cell 52 is selected. In this configuration, a semiconductor memory device is provided which can prevent erroneous read and provide stable read-out characteristic irrespectively of a change in a manufacturing process.

10 Claims, 8 Drawing Sheets

SEMICONDUCTOR MEMORY DEVICE

BACKGROUND OF THE INVENTION

1. Field of the Invention

The present invention relates to a semiconductor memory device, and more particularly to a semiconductor memory device which can provide stable read-out characteristic irrespectively of a change in a manufacturing process when a stored data is read from each of the memory cells in a memory array integrated with a high density.

2. Description of the Related Art

In the field of an LSI memory, a previously known non-volatile semiconductor memory includes a mask ROM, PROM (Programmable ROM), EPROM (Erasable and Programmable ROM), EEPROM (Electrical Erasable and Programmable ROM), etc. Particularly, the EPROM or EEPROM detects a change in the threshold voltage by a control gate according to whether or not there are charges stored in a floating gate, thereby storing data. The EEPROM includes a flash EEPROM (also referred to as "flash memory") that makes data erasure for the entire memory chip or for each block of a non-volatile semiconductor memory cell array, which is divided into some blocks.

The non-volatile semiconductor memory cell constituting the flash EEPROM is roughly classified into a split gate type and a stack gate type.

The split gate type of flash EEPROM is disclosed in WO92/18980 (G11C13/00).

Figure 3:
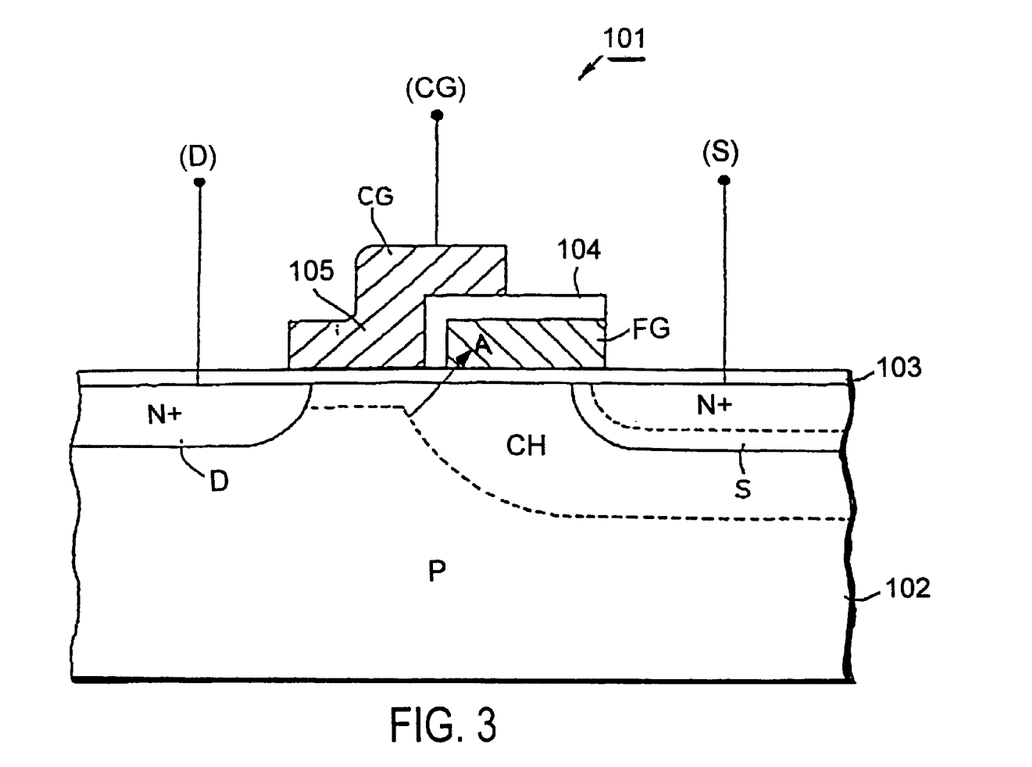
FIG. 3 is a sectional view showing a sectional structure of a non-volatile semiconductor memory cell of a split gate type.

FIG. 3 shows the sectional structure of the split-gate type non-volatile semiconductor cell 101 described in the publication (WO92/18980).

For example, an N-type source S and drain D are formed on a P-type single crystal silicon (Si) substrate 102. A floating gate FG is formed through a first insulating film 103 on a channel CH formed between the source S and the drain D. A control gate CG is formed through a second insulating film 104 on the floating gate FG. A part of the control gate DG is arranged through the first insulating film 103 on the channel CH and serves as a selecting gate 105. Storing electrons in the floating gate FG surrounded by the second insulating film 104 makes data storage.

Figure 6:
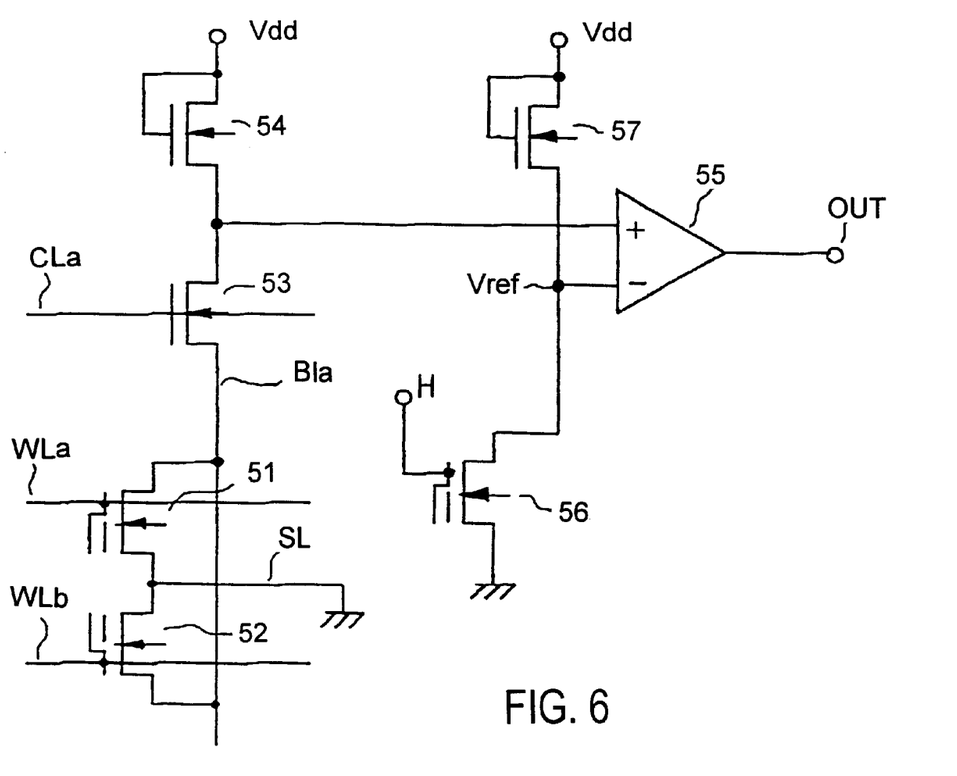
FIG. 6 is a characteristic graph for explaining the operation of the semiconductor memory device according to the embodiment.

FIG. 6 shows a read-out circuit for the above flash EEPROM. The sources of a pair of memory cells 51 and 52 are commonly connected to a source line SL. The respective control gates thereof are connected to word lines (row lines) WLa and WLb. The respective drains are connected to a single bit line BLa. A transistor 53 controlled by a column line CLa is connected to the bit line Bla.

Now, assuming that the word line WLa and the column line CLa have become an H level, the memory cell 51 is selected and connected to a voltage source Vdd through a load transistor 54. Then, a cell current Im corresponding to the stored data flows through the memory cell 51. The cell current Im is converted into a voltage by the load transistor 54 and the voltage is applied to the one input of a sense amplifier 55.

On the other hand, a reference cell 56 is provided. A voltage at the same H level as to the word line WLa is applied to the control gate of the reference cell 56. A prescribed reference current Ir flowing through the reference cell 56 is converted into a reference voltage Vref by a load transistor 57. The reference voltage Vref is applied to the other input of the sense amplifier 55. The sense amplifier 55 produces "1" or "0" which is a data stored in the memory cell 51 according to the comparison result between the voltage converted value V of the cell current and the reference voltage Vref.

In this way, using the sense amplifier, the read-out circuit amplifies the difference between the cell current flowing through the memory cell selected by the row line (word line) and column line and the reference current flowing through the reference cell so that the data stored in the memory cell is read.

As described above, the sources of the pair of memory cells 51 and 52 are commonly connected for the high integration of the memory cell array. Therefore, the source and drain in the memory cells 51 and 52 are arranged oppositely to each other by 180° on a semiconductor substrate.

Figure 7:
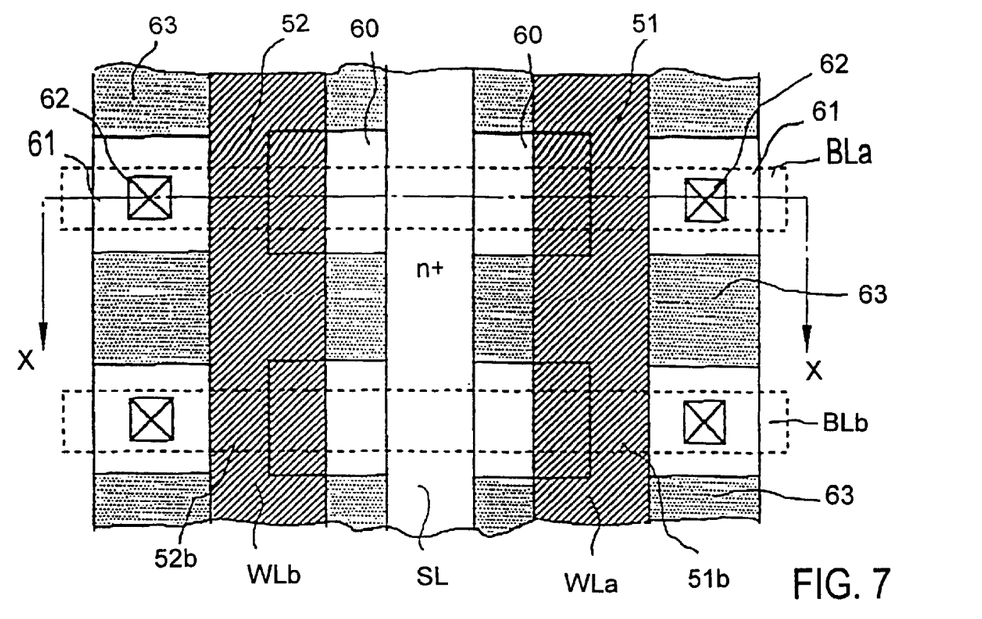
FIG. 7 is a view showing the layout of a memory cell.

Referring to FIG. 7, a detailed explanation will be given of the pattern layout of the memory cells 51 and 52. Another pair of memory cells 51b and 52b, which are adjacent to the memory cells 51 and 52, are shown. The respective n+ sources thereof are commonly connected to a source line SL. The word lines WLa and WLb are unidirectionally extended so that they are partially carried on floating gates, respectively. The n+ drains 61 of the memory cells 51 and 52 are connected to a bit line Bla through contact holes 62 made above the n+ drains 61.

The bit line Bla is extended so that it is orthogonal to the word lines WLa and WLb. The adjacent pair of memory cells 51b and 52b have the same structure as the memory cells 51 and 52. An oxide film 63 for element isolation is formed between the adjacent pairs of the memory cells.

Meanwhile, although the memory cell array described above is efficient to implement high-density integration, it presents the following problem.

Figure 8A:
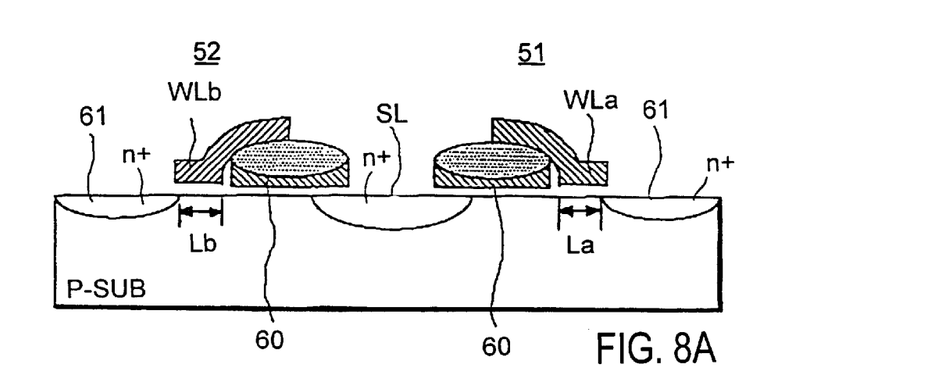
FIGS. 8A–8B are sectional view taken in line X—X in FIG. 7.
Figure 8B:
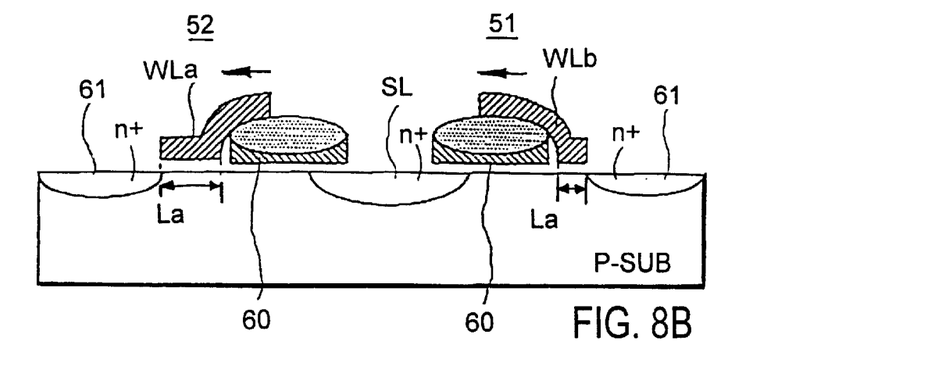

FIGS. 8A and 8B are sectional views taken in line X—X line in FIG. 7. If there is no mask drift between the word lines WLa, WLb and the floating gates 60, as seen from FIG. 8A, the lengths La abd Lb of the channel regions beneath the word lines WLa and WLb are equal to each other. Therefore, as long as the data storage state is the same for the memory cells 51 and 52, equal cell currents flow through the memory cells 51 and 52.

However, as seen from FIG. 8B, if the word lines WLa and WLb are displaced leftward for the floating gates 60, the lengths La' and Lb' of the channel regions immediately beneath the word lines WLa and WLb have a relationship Lb'>La'. This is because the n+ drains 61 are formed by ion-implantation using the word lines WLa and WLb as masks. As a result, the cell current flowing through the memory cell 52 is smaller whereas that flowing through the memory cell 51 is larger. This presents a problem that the margin for the read of the memory cell 52 is decreased.

Figure 9:
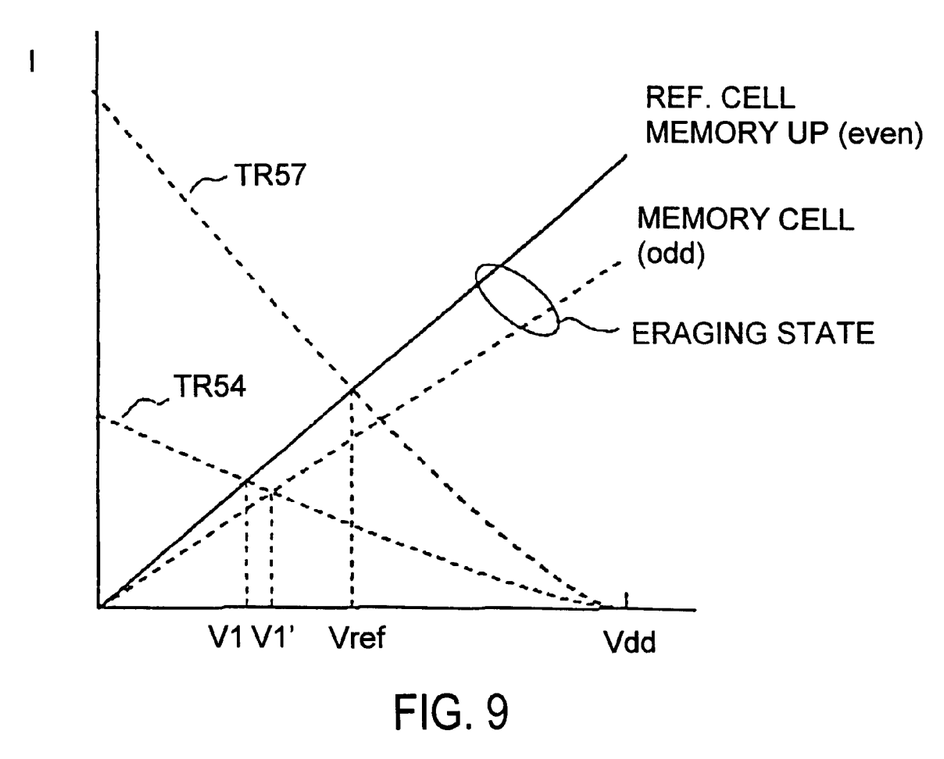
FIG. 9 is a characteristic graph showing the operation of the semiconductor memory device according to the prior art.

Referring to FIG. 9, this problem will be explained more concretely. FIG. 9 is a graph showing the operating points of a read-out circuit. The abscissa represents a voltage and the ordinate represents a current. Broken lines denote load curves of load transistors 54 and 57 and solid line denotes a current characteristic curve of the memory cells 51, 52 and reference cell 56 in their erased state (data "1").

The crossing point of the load curve of the load transistor 57 and the reference current characteristic curve of the reference cell 56 represents a reference voltage Vref. The crossing point of the load curve of the load transistor 54 and the cell current characteristic curve is a voltage-converted value of the cell current. Now it is assumed that there is mask drift as described above. Since the memory cell 51 and the reference cell 56 are oriented in the same direction, equal currents flow through these cells. Therefore, assuming that the voltage-converted value of the cell current of the memory cell 51 is V1, the cell current of the memory cell 52 decreases for the reference current so that the voltage converted value V1' of the cell current is shifted in a higher direction from V1 (V1'>V1). As a result, the margin from the reference voltage Vref is decreased, thereby producing possibility of erroneously reading the data. This problem is an obstacle against making the arrangement of the memory cells that is suited to high-density integration.

SUMMARY OF THE INVENTION

An object of the invention is to provide a semiconductor memory device that can prevent erroneous read and provide stable read-out characteristic irrespectively of a change in a manufacturing process when a stored data is read from a memory cell.

Another object of the invention is to realize high integration of a semiconductor memory.

In order to attain the above object, the semiconductor memory device according to the invention comprises a plurality of memory cells formed on a semiconductor substrate; a plurality of row lines and column lines for selecting a specific memory cell of the plurality of memory cells; first voltage applying means for passing the specific memory cell selected by the plurality of row lines and column lines; a plurality of reference cells each having the same structure as that of each of the plurality of memory cells and formed on the semiconductor substrate; second voltage applying means for passing a reference current through each of the reference cells; and sense amplifier means for comparing the cell current and the reference current, and is characterized in that the plurality of memory cells include a plurality of memory cell groups arranged in plural different source/drain directions, and the reference cells to each of the memory cell groups are arranged in the same direction as the memory cells in the corresponding memory cell group.

Specifically, the semiconductor memory device according to the invention comprises a first memory cell group including first memory cells each having a first source/ drain direction and a second memory cell group including second memory cells each having a second source/drain direction, and a first and a second reference cell corresponding to the first and the second memory cell group, and is characterized in that the first reference cell or the second reference cell is selected according to whether the first or the second memory cell group has been selected.

In accordance with the invention, since the source/drain directions of the memory cell groups are coincident to those of the reference memory cells, mask drifts are generated in the same manner. Therefore, the margin of read-out of the data stored in the memory cells can be assured sufficiently, thereby preventing erroneous read-out.

Further, the semiconductor memory device according to the invention comprises a plurality of memory cells formed on a semiconductor substrate, the memory cells constituting a plurality of memory cell groups each having a first memory cell and a second memory cell with their sources commonly connected to a source line and their drains commonly connected to a single column line, and selected by adjacent row lines, respectively; first voltage applying means for passing a current through a specific memory cell selected by the row line and column line; a first and a second reference cell each having the same structure as that of each of the first and the second memory cell and formed on the semiconductor substrate; a selecting circuit for selecting either one of the first and the second reference cell; second voltage applying means for passing a reference current through the reference cell selected by the selecting circuit; and sense amplifier means for comparing the cell current and the reference current, and characterized in that the first memory cell is selected, the selecting circuit selects the first reference cell, and where the second memory cell is selected, the selecting circuit selects the second reference cell.

In accordance with the invention, the semiconductor memory device can be integrated with high density. In addition, the margin of read-out of the data stored in the memory cells can be assured sufficiently, thereby preventing erroneous read-out.

Further, the semiconductor apparatus according to the invention comprises second comprises first and second reference voltage applying means for passing reference currents through the first and the second reference cell as the second voltage applying means; a switching circuit for producing either one of the first and the second reference current; and sense amplifier means for comparing the cell current and the reference current produced by the switching circuit. Where the first memory cell is selected, the switching circuit produces the first reference current, and where the second memory cell is selected, the switching circuit produces the second reference current.

This configuration described above, in which the voltage applying means is given to each of the reference cells, has an increase occupied area, but permits high-speed operation, and can provide a semiconductor memory device with high write/read speed.

In short, in accordance with the invention, a semiconductor memory device can be provided which can prevent erroneous read and provide stable read-out characteristic irrespectively of a change in a manufacturing process when data is read stored in a memory cell.

The freedom of arrangement of semiconductor memory cells can be assured, thereby realizing the high integration of the memory cell array.

The above and other objects and features of the invention will be more apparent from the following description taken in conjunction with the accompanying drawings.

DESCRIPTION OF THE PREFERRED EMBODIMENTS

Now referring to the drawings, an explanation will be given of several embodiments of the invention.

Embodiment 1

Figure 1:
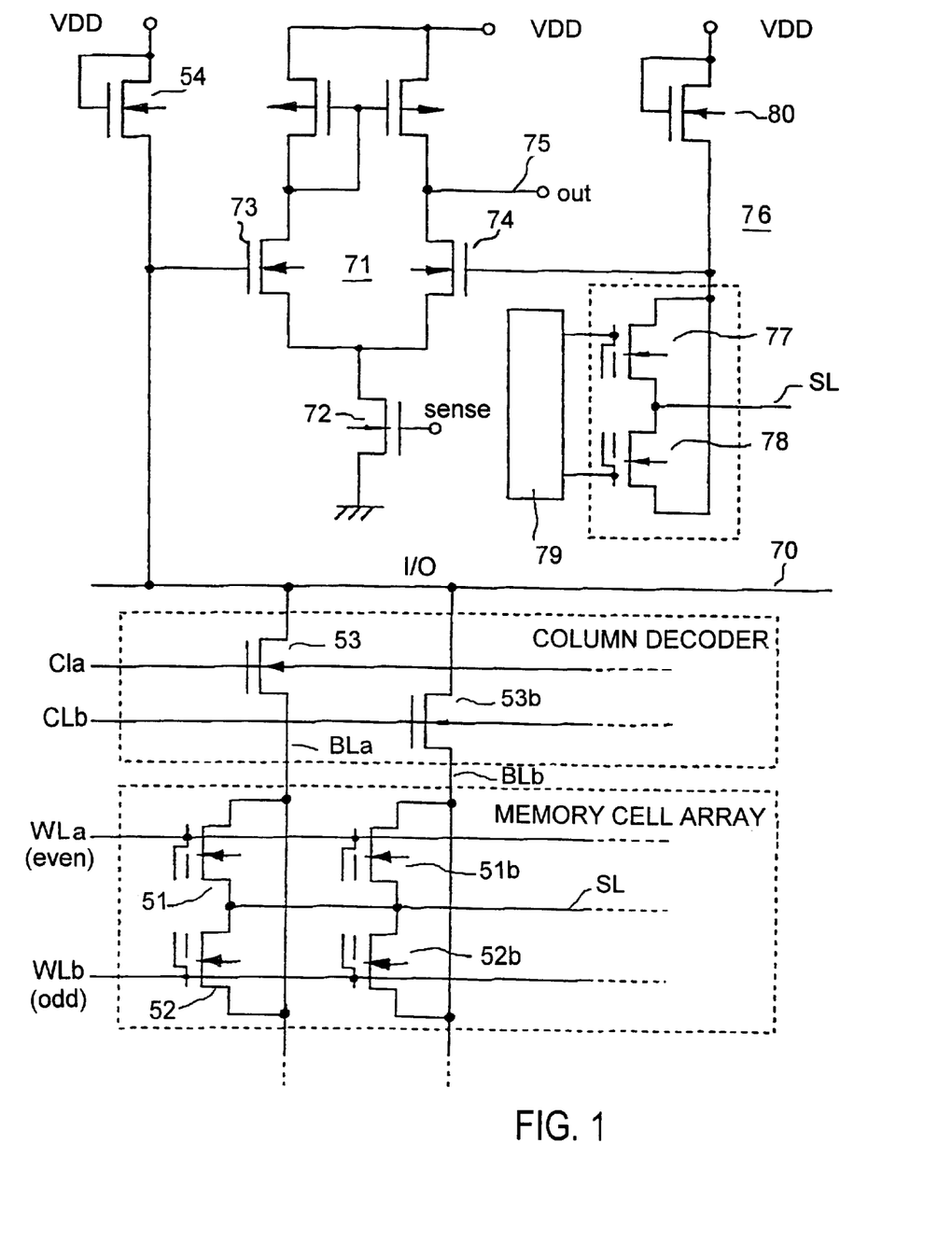
FIG. 1 is a circuit diagram of a semiconductor memory device according to a first embodiment of the invention.

Each of the memory cells constituting a memory cell array according to a first embodiment of the invention has a split gate type of memory cell structure as shown in FIG. 3. Referring to FIG. 1, an explanation will be given of the structure of the memory cell array. The sources of a pair of memory cells 51 and 52 are commonly connected to a source line SL. The respective control gates thereof are connected to word lines (row lines) WLa and WLb. The respective drains are connected to a single bit line BLa.

A pair of memory cells 51b and 52b having the same structure as those of the memory cells 51 and 52 are arranged adjacently to the memory cells 51 and 52. The respective drains of the memory cells 51b and 52b are connected to a single bit line BLb. The plan view and sectional view of these memory cells are shown in FIGS. 7 and 8, respectively.

A transistor 53 controlled by a column line CLa is connected to the bit line BLa. A transistor 53b controlled by a column line CLb is connected to the bit line BLb. These transistors 53, 53b, . . . constitute a column decoder. The same arrangement is repeated adjacently to the memory cells 51b, 52b. In this way, the arrangement of the memory cells 51, 52 is repeated in a row and a column direction. The memory cell 51 refers to an even cell, whereas the memory cell 52 refers to an odd cell. In terms of the row address, the cell corresponding to an even address is an even cell and the cell corresponding to an odd address is an odd cell. An arrangement of these memory cells 51, 52; 51b, 52b; . . . constitutes a single sector. The memory cell array is an assembly of plurality of sectors.

The bit lines BLa, BLb, . . . are connected to an I/O line 70 through the transistors 53, 53b, . . . The I/O line 70 is connected to the drain of a load transistor 54. The source and gate of the load transistor 54 are connected to a power source voltage VDD. The load transistor 54 serves to apply a drain voltage to a selected memory cell so that a cell current flows through the memory cell.

A sense amplifier 71 is an current mirror type differential amplifier. The sense amplifier 71 is activated when an N-channel MOS transistor 72 turns on. The N-channel MOS transistor 72 is controlled by a sense signal or read enable signal. The I/O line 70 is connected to the gate of the one input transistor 73 of the sense amplifier 71. A reference voltage is applied to the gate of the other input transistor 74 of the sense amplifier 71. The sense amplifier 71 has an output terminal 75.

A reference voltage generating circuit 76 is provided to generate a reference voltage. In this embodiment, a pair of reference cells 77 and 78 has the same structure as that of the memory cells 51 and 52 and is arranged in the same direction on the semiconductor substrate. Namely, the memory cell 51 and the reference cell 77 (even cell) are coincident in their source/drain direction. The memory cell 52 and the reference cell 78 (odd cell) are coincident in their source/drain direction.

A selection circuit 79 is provided to select one of the reference cells 77 and 78. The selection circuit 79 selects the reference cell 77 when the memory cell 51 is selected, whereas the selection circuit 79 selects the reference cell 78 when the memory cell 52 is selected. In this way, the selection circuit 79 selects the reference cell according to which of the even cell (corresponding to an even address) and the odd cell (corresponding to an odd address) has been selected. Therefore, the selection circuit 79 can be simply structured.

The source and gate of a load transistor 80 is connected to a power source voltage VDD. The load transistor 80 serves to apply a drain voltage to a selected reference cell so that a reference current flows through the reference cell.

The reference voltage generating circuit 76 generates a first reference voltage Vref1 according to a first reference current (reference cell 77), and generates a second reference voltage Vref2 according to a second reference voltage Vref 2. The first reference voltage Vref1 or the second reference voltage Vref2 is applied to the sense amplifier 71.

Now, an explanation will be given of the operation of the read-out circuit according to this embodiment. First, after data is previously erased from each memory cell, a prescribed data is written in the memory cell. Where data "0" is stored in the memory cell in an erased state (data "1"), a prescribed low voltage is applied to the word line of a selected memory cell and a high voltage is applied to the source line SL. Thus, channel hot electrons are injected into the floating gate of the memory cell. On the other hand, where data "1" is written in the memory cell, the source line SL is connected to ground so that the erased state is maintained.

Now, in the read-out, when the word line WLa and column line CLa become an H level, the memory cell 51 is selected and connected to a voltage source Vdd through a load transistor 54. Then, a cell current Im corresponding to the stored data flows through the memory cell 51. The cell current Im is converted into a voltage by the load transistor 54 and the voltage is applied to the one input of the sense amplifier 71.

On the other hand, in the reference voltage generating circuit 76, the reference cell 77 is selected by the selection circuit 79 to produce the first reference voltage Vref1 that is applied to the other input of the sense amplifier 71.

When the sense signal becomes the H level, the sense amplifier 71 is activated, and produces "1" or "0" which is the data stored in the memory cell 51 on the basis of the comparison result between the voltage-converted value V of the cell current and the first reference voltage Vref1.

Figure 2:
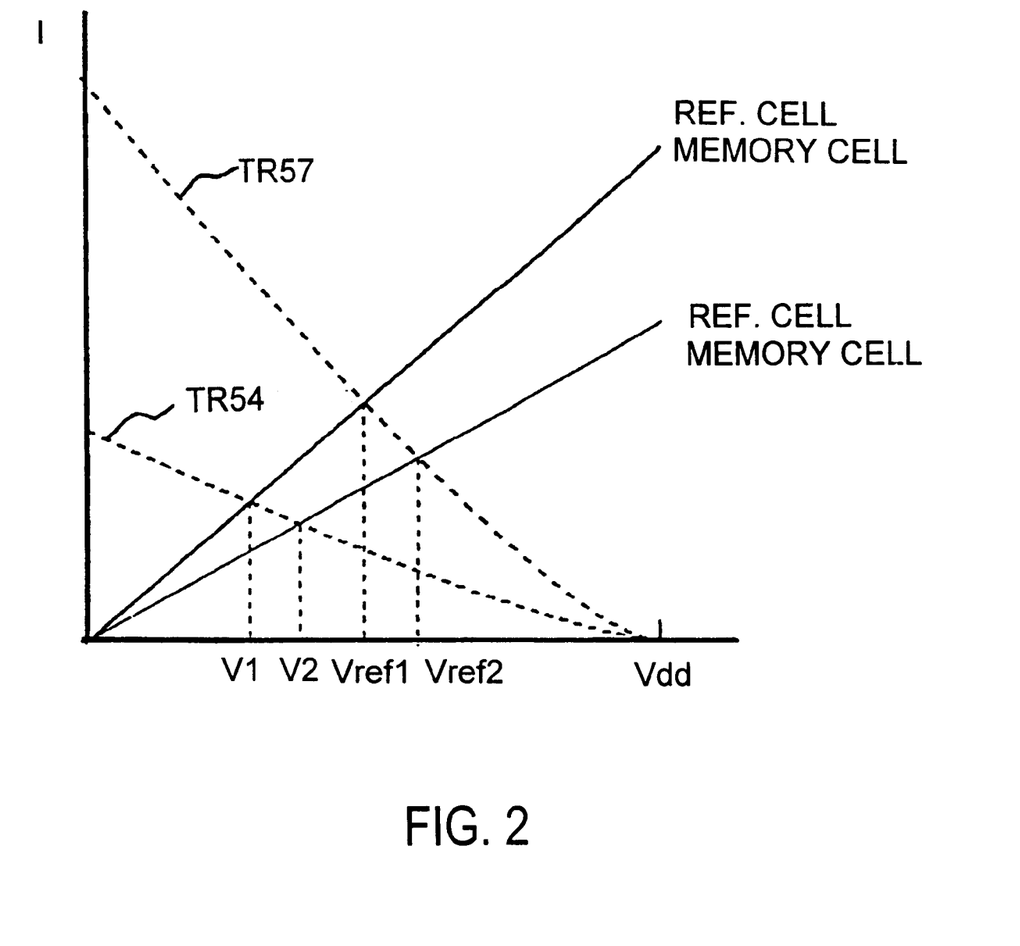
FIG. 2 is a characteristic graph for explaining the operation of the semiconductor memory device according to the embodiment.

In accordance with the above configuration, even when there is a mask drift between the word lines WLa, WLb and the floating gates 60, the margin for the read voltage is not decreased. Referring to FIG. 2, this will be explained in more detail. FIG. 2 is a graph showing the operating points of a read-out circuit. The abscissa represents a voltage and the ordinate represents a current. Broken lines denote load curves of load transistors 54 and 57 and solid lines denote current characteristic curve of the memory cells 51, 52 and reference cells 77, 78 in their erased state (data "1").

In accordance with the invention, the cell current of the memory cell 51 (even cell) is coincident to the first reference current flowing through the reference cell 77. On the other hand, the cell current of the memory cell 52 (odd cell) is coincident to the second reference current flowing through the reference cell 78. This assures a constant margin for the read voltage.

Specifically, on the graph, the crossing point of the load curve of the load transistor 57 and the reference current characteristic curve of the reference cell 77 represents the first reference voltage Vref1. The crossing point of the load curve of the load transistor 54 and the cell current characteristic curve of the memory cell 51 is a voltage-converted value V1 of the cell current. The sense amplifier compares the first reference voltage Vref1 and the voltage converted value V1 so that the margin for the read voltage is Vref1−V1.

On the other hand, the crossing point of the load curve of the load transistor 57 and the reference current characteristic curve of the reference cell 78 represents the second reference voltage Vref2. The crossing point of the load curve of the load transistor 54 and the cell current characteristic curve of the memory cell 52 is a voltage-converted value V2 of the cell current. Thus, the margin for the read voltage is Vref2−V2.

When the cell current of the memory cell 52 decreases owing to the mask drift, the second reference current also decreases. Therefore, there are relationships: Vref2>Vref1 and V2>V1. This assures the read margin. In the above explanation, it was assumed that the data of the memory cell is "1". However, it is apparent that in the case of the data of "0" also, the read margin can be assured.

Additionally, in the above embodiment, the memory cell array includes two memory cell groups of the even cell group and the odd cell group, and two reference cells corresponding to the two memory cell groups. However, the present invention should not be limited to provision of these two memory cell groups, but can be applied to a semiconductor memory device including two or more memory cell groups arranged in different directions and two or more reference cells corresponding to them.

Further, in the above embodiment, the memory cell was a split-gate type non-volatile semiconductor memory cell. However, the memory cell may be a dynamic RAM or static RAM as long as it is asymmetrical with respect to the center of the channel region between the source and drain.

Further, in the above embodiment, although a single voltage-applying means were provided for the plurality of reference cells so that one of them is selectively connected, the voltage-applying means may be provided for each of these pluralities of reference cells.

Embodiment 2

As a second embodiment, an embodiment will be explained in which the voltage applying means is provided for each of the reference cells. Each of the memory cells constituting a memory cell array according to the second embodiment of the invention has a split gate type of memory cell structure as shown in FIG. 3 as in the first embodiment.

Figure 4:
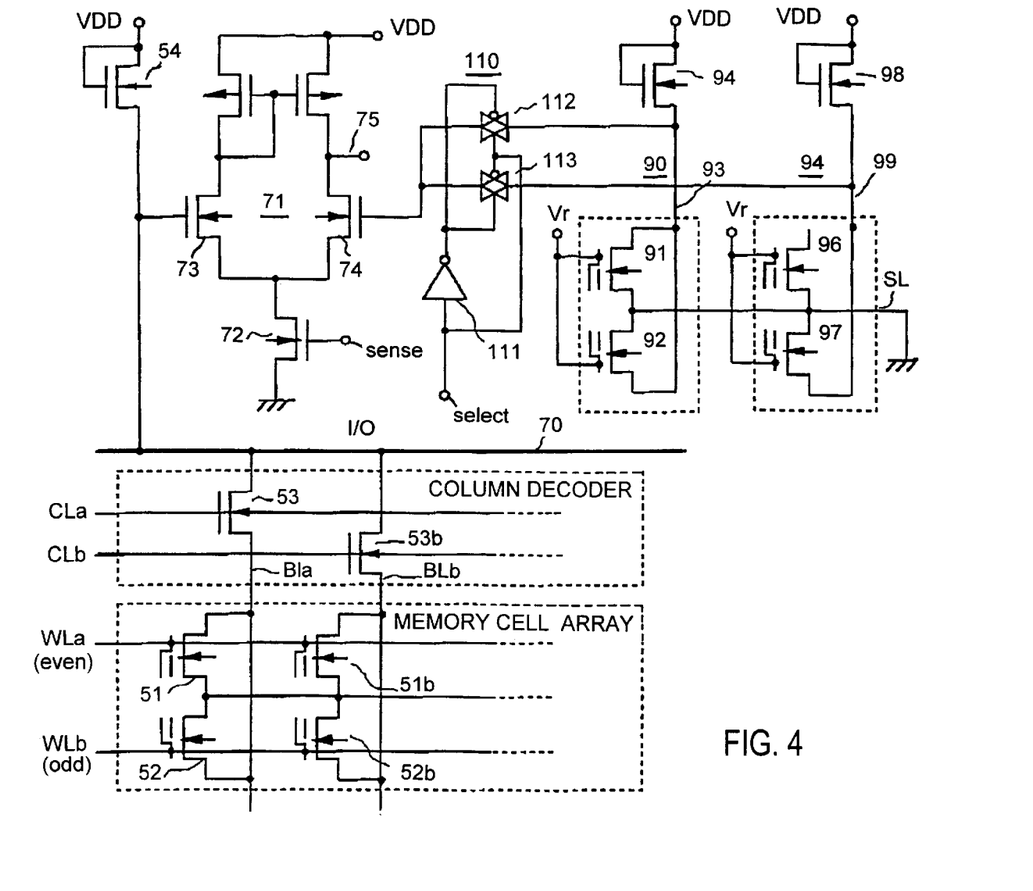
FIG. 4 is a circuit diagram for explaining the semiconductor memory device according to a prior art.

Referring to FIG. 4, an explanation will be given of the structure of the memory cell array. In this embodiment, like reference numerals refer to like elements in the first embodiment. The sources of a pair of memory cells 51 and 52 are commonly connected to a source line SL. The respective control gates thereof are connected to word lines (row lines) WLa and WLb. The respective drains are connected to a single bit line BLa. A pair of memory cells 51b and 52b having the same structure as those of the memory cells 51 and 52 are arranged adjacently to the memory cells 51 and 52. The respective drains of the memory cells 51b and 52b are connected to a single bit line BLb. The plan view and sectional view of these memory cells are shown in FIGS. 7 and 8, respectively. A transistor 53 controlled by a column line CLa is connected to the bit line BLa. A transistor 53b controlled by a column line CLb is connected to the bit line BLb. These transistors 53, 53b, constitute a column decoder. The same arrangement is repeated adjacently to the memory cells 51b, 52b. In this way, the arrangement of the memory cells 51, 52 is repeated in a row and a column direction. The memory cell 51 refers to an even cell, whereas the memory cell 52 refers to an odd cell. In terms of the row address, the cell corresponding to an even address is an even cell and the cell corresponding to an odd address is an odd cell.

An arrangement of these memory cells 51, 52; 51b, 52b; . . . constitutes a single sector. The memory cell array is an assembly of plurality of sectors.

The bit lines BLa, BLb, . . . are connected to an I/O line 70 through the transistors 53, 53b, . . . The I/O line 70 is connected to the drain of a load transistor 54. The source and gate of the load transistor 54 are connected to a power source voltage VDD. The load transistor 54 serves to apply a drain voltage to a selected memory cell so that a cell current flows through the memory cell.

A sense amplifier 71 is an current mirror type differential amplifier. The sense amplifier 71 is activated when an N-channel MOS transistor 72 turns on. The N-channel MOS transistor 72 is controlled by a sense signal or read enable signal. The I/O line 70 is connected to the gate of the one input transistor 73 of the sense amplifier 71. A reference voltage described blow is applied to the gate of the other input transistor 74 of the sense amplifier 71. The sense amplifier 71 has an output terminal 75.

A first reference voltage generating circuit 90 is provided to generate a first reference voltage. In this embodiment, a pair of reference cells 91 and 92 has the same structure as that of the memory cells 51 and 52 and is arranged in the same direction on the semiconductor substrate. Namely, the memory cell 51 and the reference cell 91 (even cell) are coincident in their source/drain direction. The memory cell 52 and the reference cell 92 (odd cell) are coincident in their source/drain direction. A prescribed read-out voltage Vr is always applied to the control gates of these reference cells 91, 92.

In the first reference voltage generating circuit 90, in order that only the reference cell 91 corresponding to the memory cell 51 (even cell) of the pair of reference cells is used, the drain of the reference cell 92 is separated from an output line 93. The source and gate of a load transistor 94 is connected to a power source voltage VDD. The load transistor 94 serving as a load resistor applies a drain voltage to the reference cell 91 so that a reference current flows through the reference cell. The first reference voltage generating circuit 90 generates a first reference voltage Vref1 that has been converted from the reference current.

A second reference voltage circuit 94 includes reference cells 96, 97 and a load transistor 98. Unlike the first reference voltage circuit 90, in order that only the reference cell 97 corresponding to the memory cell 52 (odd cell) is used, the reference cell 96 is separated from an output line 99.

The reference cells 92 and 96 may be cancelled since they are not used. However, since the reference cells are arranged in the same configuration as the pair of memory cells 51 and 52, the corresponding cells have the characteristics with higher coincidence and can be more easily designed.

A switching circuit 110 includes an inverter 111 and transmission gates 112 and 113. The inverter 51 is supplied with a selecting signal (select). Therefore, the switching is executed as follows. Where the memory cell 51 (even cell) is selected, the select signal becomes an H level so that the first reference voltage Vref1 is applied to the gate of the input transistor 74 of the sense amplifier 71. Where the memory cell 52 (odd cell) is selected, the select signal becomes an L level so that the second reference voltage Vref1 is applied to the gate of the input transistor 74 of the sense amplifier 71.

Now, an explanation will be given of the operation of the read-out circuit according to this embodiment. First, after data is previously erased from each memory cell, a prescribed data is written in the memory cell. Where data "0" is stored in the memory cell in an erased state (data "1"), a prescribed low voltage is applied to the word line of a selected memory cell and a high voltage is applied to the source line SL. Thus, channel hot electrons are injected into the floating gate of the memory cell. On the other hand, where data "1" is written in the memory cell, the source line SL is connected to ground so that the erased state is maintained.

Now, in the read-out, when the word line WLa and column line CLa become an H level, the memory cell 51 is selected and connected to a voltage source Vdd through a load transistor 54. Then, a cell current Im corresponding to the stored data flows through the memory cell 51. The cell current Im is converted into a voltage by the load transistor 54 and the voltage is applied to the one input of the sense amplifier 71.

On the other hand, the first reference voltage Vref1 is produced through the transmission gate 112 by the switching circuit 110 and applied to the other input of the sense amplifier 71.

When the sense signal becomes the H level, the sense amplifier 71 is activated, and produces "1" or "0" which is the data stored in the memory cell 51 on the basis of the comparison result between the converted voltage V of the cell current and the first reference voltage Vref1.

In accordance with the above configuration, even when there is a mask drift between the word lines WLa, WLb and the floating gates 60, the margin for the read voltage is not decreased. Referring to FIG. 2, this will be explained in more detail.

Figure 5:
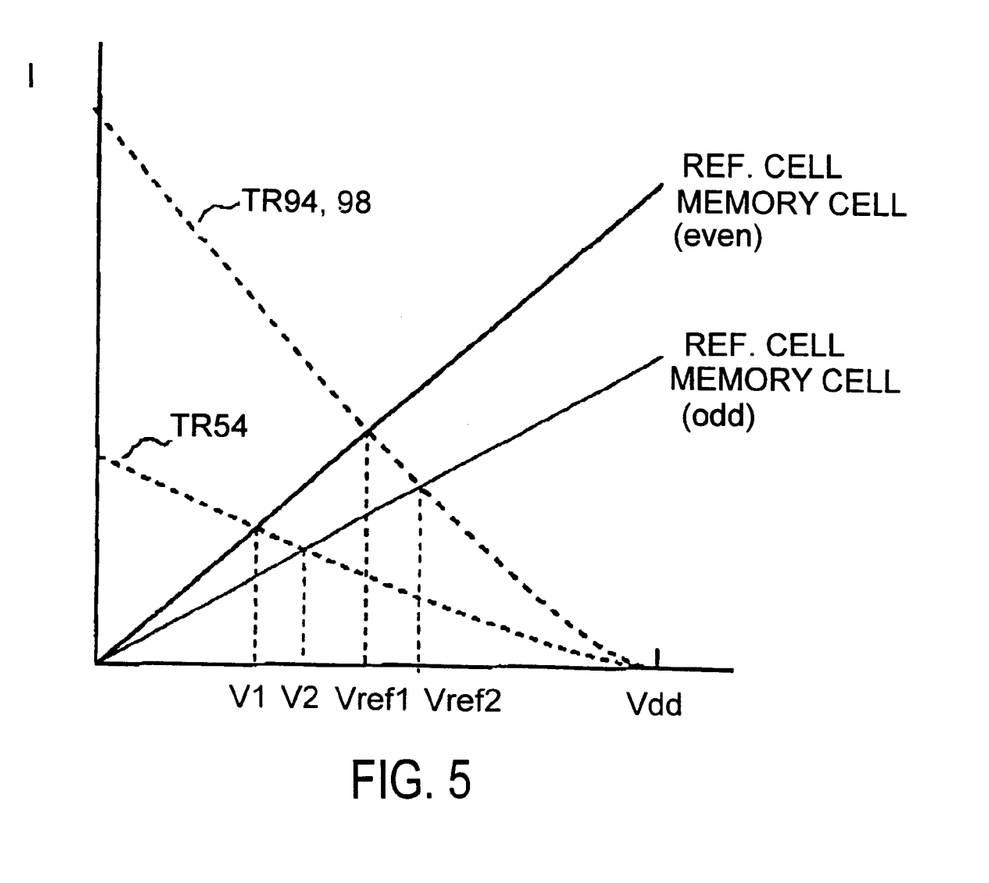
FIG. 5 is a circuit diagram of a semiconductor memory device according to a second embodiment of the invention.

FIG. 5 is a graph showing the operating points of a read-out circuit. The abscissa represents a voltage and the ordinate represents a current. Broken lines denote load curves of load transistors 54, 94 and 99 and solid lines denote current characteristic curve of the memory cells 51, 52 and reference cells 91, 97 in their erased state (data "1").

In accordance with the invention, the cell current of the memory cell 51 (even cell) is coincident to the first reference current flowing through the reference cell 91. On the other hand, the cell current of the memory cell 52 (odd cell) is coincident to the second reference current flowing through the reference cell 97. This assures a constant margin for the read voltage.

Specifically, on the graph, the crossing point of the load curve of the load transistor 94 and the reference current characteristic curve of the reference cell 91 represents the first reference voltage Vref1. The crossing point of the load curve of the load transistor 54 and the cell current characteristic curve of the memory cell 51 is a voltage-converted value V1 of the cell current. The sense amplifier compares the first reference voltage Vref1 and the voltage converted value V1 so that the margin for the read voltage is Vref1−V1.

On the other hand, the crossing point of the load curve of the load transistor 98 and the reference current characteristic curve of the reference cell 97 represents the second reference voltage Vref2. The crossing point of the load curve of the load transistor 98 and the cell current characteristic curve of the memory cell 52 is a voltage-converted value V2 of the cell current. Thus, the margin for the read voltage is Vref2−V2.

When the cell current of the memory cell 52 decreases owing to the mask drift, the second reference current also decreases. Therefore, there are relationships: Vref2>Vref1 and V2>V1. This assures the read margin. In the above explanation, it was assumed that the data of the memory cell is "1". However, it is apparent that in the case of the data of "0" also, the read margin can be assured.

This configuration described above, in which the voltage applying means is given to each of the reference cells, has an increase occupied area, but permits high-speed operation, and can provide a semiconductor memory device with high write/read speed.

What is claimed is:

1. A semiconductor memory device comprising:
    a plurality of memory cells formed on semiconductor substrate;
    a plurality of row lines and column lines for selecting a specific memory cell of said plurality of memory cells;
    first voltage applying means for passing a cell current through the specific memory cell selected by said plurality of row lines and column lines;
    a plurality of reference cells each having the same structure as that of each of the plurality of memory cells and formed on said semiconductor substrate;
    second voltage applying means for passing a reference current through each of said reference cells; and
    sense amplifier means for comparing the cell current and the reference current, wherein
    said plurality of memory cells include a plurality of memory cell groups arranged in plural different source/drain directions, and cell-layout is set so that the reference cells to each of the memory cell groups are arranged in the same direction as the memory cells in the corresponding memory cell group.

2. A semiconductor memory device according to claim 1, wherein the memory cells are arranged in a matrix shape, and said memory cell groups have common source regions along the column lines, and the memory cell groups adjacent to each other are linearly symmetrical along a source line connecting said source regions.

3. A semiconductor memory device according to claim 2, each of the memory cells and said reference cells is a split-gate type non-volatile semiconductor memory cell.

4. A semiconductor memory device comprising:
    a plurality of memory cells formed on a semiconductor substrate, said memory cells constituting a plurality of memory cell groups each having a first memory cell and a second memory cell with their sources commonly connected to a source line and their drains commonly connected to a single column line, and selected by adjacent row lines, respectively;
    first voltage applying means for passing a current through a specific memory cell selected by the row line and column line;
    a first and a second reference cell each having the same structure as that of each of the first and the second memory cell and formed on the semiconductor substrate;
    a selecting circuit for selecting either one of said first and said second reference cell;
    second voltage applying means for passing a reference current through the reference cell selected by said selecting circuit; and
    sense amplifier means for comparing said cell current and said reference current, wherein where said first memory cell is selected, the selecting circuit selects the first reference cell, and where said second memory cell is selected, said selecting circuit selects said second reference cell.

5. A semiconductor memory device according to claim 4, wherein each of said first and said second memory cell and said first and said second reference cell is a split-gate type non-volatile semiconductor memory cell.

6. A semiconductor memory device according to claim 1, further comprising current/voltage converting means for converting said cell current and the reference current into a cell voltage and a reference voltage, respectively, wherein said sense amplifier means compares the cell voltage with said reference voltage.

7. A semiconductor memory device according to claim 6, wherein said current/voltage converting means includes first load resistor means to which said first and said second memory cell are connected, and second load resistor means to which said first and said second reference cell are connected.

8. A semiconductor memory device according to claim 7, wherein said first and said second load resistor means are MOS transistors.

9. A semiconductor memory device according to claim 1, wherein:

said second voltage applying means comprises a first reference voltage applying means for passing a first reference current through the first reference cell;

a second reference voltage applying means for passing a second reference current through the second reference cell;

a switching circuit for producing either one of said first and said second reference current; and sense amplifier means for comparing the cell current and the reference current produced by said switching circuit, wherein where said first memory cell is selected, said switching circuit produces said first reference current, and where said second memory cell is selected, said switching circuit produces said second reference current.

10. A semiconductor memory device comprising:

a plurality of memory cells formed on semiconductor substrate;

a plurality of row lines and column lines for selecting a specific memory cell of said plurality of memory cells;

first voltage applying means for passing a cell current through the specific memory cell selected by said plurality of row lines and column lines;

a plurality of reference cells each having the same structure as that of each of the plurality of memory cells and formed on said semiconductor substrate;

second voltage applying means for passing a reference current through each of said reference cells; and sense amplifier means for comparing the cell current and the reference current, wherein the memory cells are arranged in a matrix shape, and a group of said memory cells has common source regions along the column lines, and the memory cells adjacent to each other are linearly symmetrical along a source line connecting said source regions, and the reference cells corresponding to the memory cell group are arranged in the same direction as the memory cell group.

* * * * *